United States Patent
Ikeda et al.

(10) Patent No.: US 9,703,753 B2
(45) Date of Patent: Jul. 11, 2017

(54) APPARATUS AND METHOD FOR UPDATING A DEVICE

(71) Applicant: FUJITSU LIMITED, Kawasaki-shi, Kanagawa (JP)

(72) Inventors: Kazuya Ikeda, Kawasaki (JP); Masato Kobayashi, Oyama (JP)

(73) Assignee: FUJITSU LIMITED, Kawasaki (JP)

(*) Notice: Subject to any disclaimer, the term of this patent is extended or adjusted under 35 U.S.C. 154(b) by 383 days.

(21) Appl. No.: 14/154,242

(22) Filed: Jan. 14, 2014

(65) Prior Publication Data

US 2014/0289506 A1 Sep. 25, 2014

(30) Foreign Application Priority Data

Mar. 19, 2013 (JP) ................. 2013-057379

(51) Int. Cl.
| | |
|---|---|
| *G06F 9/00* | (2006.01) |
| *G06F 9/24* | (2006.01) |
| *G06F 15/177* | (2006.01) |
| *G06F 17/50* | (2006.01) |
| *G06F 15/78* | (2006.01) |
| *G06F 9/445* | (2006.01) |

(52) U.S. Cl.
CPC ............ *G06F 15/7871* (2013.01); *G06F 8/65* (2013.01); *G06F 9/44505* (2013.01); *G06F 15/177* (2013.01); *G06F 15/7867* (2013.01); *G06F 17/5054* (2013.01)

(58) Field of Classification Search
CPC .... G06F 15/7867; G06F 9/44505; G06F 8/65; G06F 15/177; G06F 17/5054

USPC ......... 713/1, 2, 100; 718/116, 117; 716/116, 716/117
See application file for complete search history.

(56) References Cited

U.S. PATENT DOCUMENTS

| | | | | |
|---|---|---|---|---|
| 6,326,806 | B1 * | 12/2001 | Fallside ............. | G06F 15/7867 326/38 |
| 7,577,726 | B1 * | 8/2009 | Conard .................. | G06F 8/665 709/221 |
| 2009/0079467 | A1 * | 3/2009 | Sandven ............. | G06F 15/7867 326/38 |
| 2010/0325404 | A1 * | 12/2010 | Aldereguia ............... | G06F 8/65 713/2 |

FOREIGN PATENT DOCUMENTS

JP 9-218781 8/1997

OTHER PUBLICATIONS

Cisco Systems, Inc., "Input/Output Controller Replacement Instructions", Feb. 2008, retrieved from the World Wide Web at http://www.cisco.com/c/en/us/td/docs/routers/7200/install_and_upgrade/7200_i-o_controller_install/4447io.pdf).*

\* cited by examiner

*Primary Examiner* — Ji H Bae
(74) *Attorney, Agent, or Firm* — Staas & Halsey LLP

(57) ABSTRACT

An apparatus for updating a device, includes: a card configured to include a first device; a controller configured to acquire first circuit data from the card and to update a second device by using the first circuit data; and a storage unit configured to store, from the card, second circuit data for updating the first device, wherein the controller acquires the second circuit data stored in the storage unit and updates the first device by using the second circuit data.

6 Claims, 16 Drawing Sheets

APPARATUS AND METHOD FOR UPDATING A DEVICE

CROSS-REFERENCE TO RELATED APPLICATION

This application is based upon and claims the benefit of priority from the prior Japanese Patent Application No. 2013-057379 filed on Mar. 19, 2013, the entire contents of which are incorporated herein by reference.

FIELD

The embodiments discussed herein relate to an apparatus and method for updating a device.

BACKGROUND

There have been used communication apparatuses having multiple cards (including printed circuit boards) mounted in a shelf thereof. In such a communication apparatus, each card typically has thereon a central processing unit (CPU) and a random access memory (RAM), as well as a programmable logic device (PLD) which allows rewriting of circuit data on board. The PLD includes a configuration memory holding the circuit data. Rewriting the circuit data in the configuration memory updates the PLD. The circuit data is typically rewritten using a writing tool connected to an external apparatus through a cable. For this reason, if the communication apparatus is disposed in a field, such as a client site, the PLD is difficult to update.

For this reason, there have been developed communication apparatuses in recent years which have thereon cards which allow rewriting of the circuit data even in a field through software processing by a processor, such as the CPU. In such a card, the PLD typically plays an indispensable role in the operation of the processor. Accordingly, if the PLD stops other operations when it starts rewriting the circuit data, the processor may stop reading data from the RAM. Consequently, there arises a concern that the card and communication apparatus may not function normally.

As a method for reducing the concern, there have been known cards including a PLD which holds, in a configuration memory thereof, circuit data to be rewritten (hereafter referred to as "a PLD to be updated") and additionally including a device configured to output, to the PLD, a signal for rewriting the circuit data (hereafter referred to as "a device used for update"; this signal will be referred to as a configuration signal). In such a card, a CPU transfers circuit data in the RAM to the device used for update through software processing and stores the data therein. Next, with the PLD to be updated, the CPU, and the RAM stopped in the card, the device used for update autonomously rewrites the circuit data held in the configuration memory of the PLD to be updated on the basis of the configuration signal. Thus, the PLD is updated.

Japanese Laid-open Patent Publication No. 9-218781 is an example of related art.

SUMMARY

According to an aspect of the invention, an apparatus for updating a device, includes: a card configured to include a first device; a controller configured to acquire first circuit data from the card and to update a second device by using the first circuit data; and a storage unit configured to store, from the card, second circuit data for updating the first device, wherein the controller acquires the second circuit data stored in the storage unit and updates the first device by using the second circuit data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The traditional method for updating a PLD allows a PLD to be updated in a field, regardless of the purpose of the PLD. On the other hand, the communication apparatus has to have a device used for update for each card. Consequently, the mounting area or cost of the cards is increased. This is more remarkable in communication apparatuses having more cards mounted in the shelf. A conceivable solution is to dispose a device used for update in a common unit of the shelf in order for the cards to commonly use the device used for update. Thus, an increase in the mounting area or cost of the cards is controlled.

However, for the PLD to be updated, the method for rewriting data in the configuration memory thereof or the interface therefor varies among manufacturers or types of the PLD to be updated. For this reason, the device used for update disposed in the common unit preferably adapts to all conceivable PLD to be updated. However, even after the communication apparatus is shipped, many manufacturers develop new types of cards over time. Accordingly, for example, even if the device used for update of the common unit of the communication apparatus has a function capable of updating the PLDs of respective products of companies A and B on the basis of the configuration signal, when a card including a PLD of a company C, which has not been anticipated, is mounted on the communication apparatus, the device used for update has difficulty in updating the PLD (a product of the company C) in the card through software processing by a processor.

Hereafter, an embodiment of an apparatus and method for updating a device disclosed in the present application will be described in detail with reference to the drawings. However, the apparatus and method for updating a device disclosed in the present application are not limited to the embodiment.

First Embodiment

Figure 1:
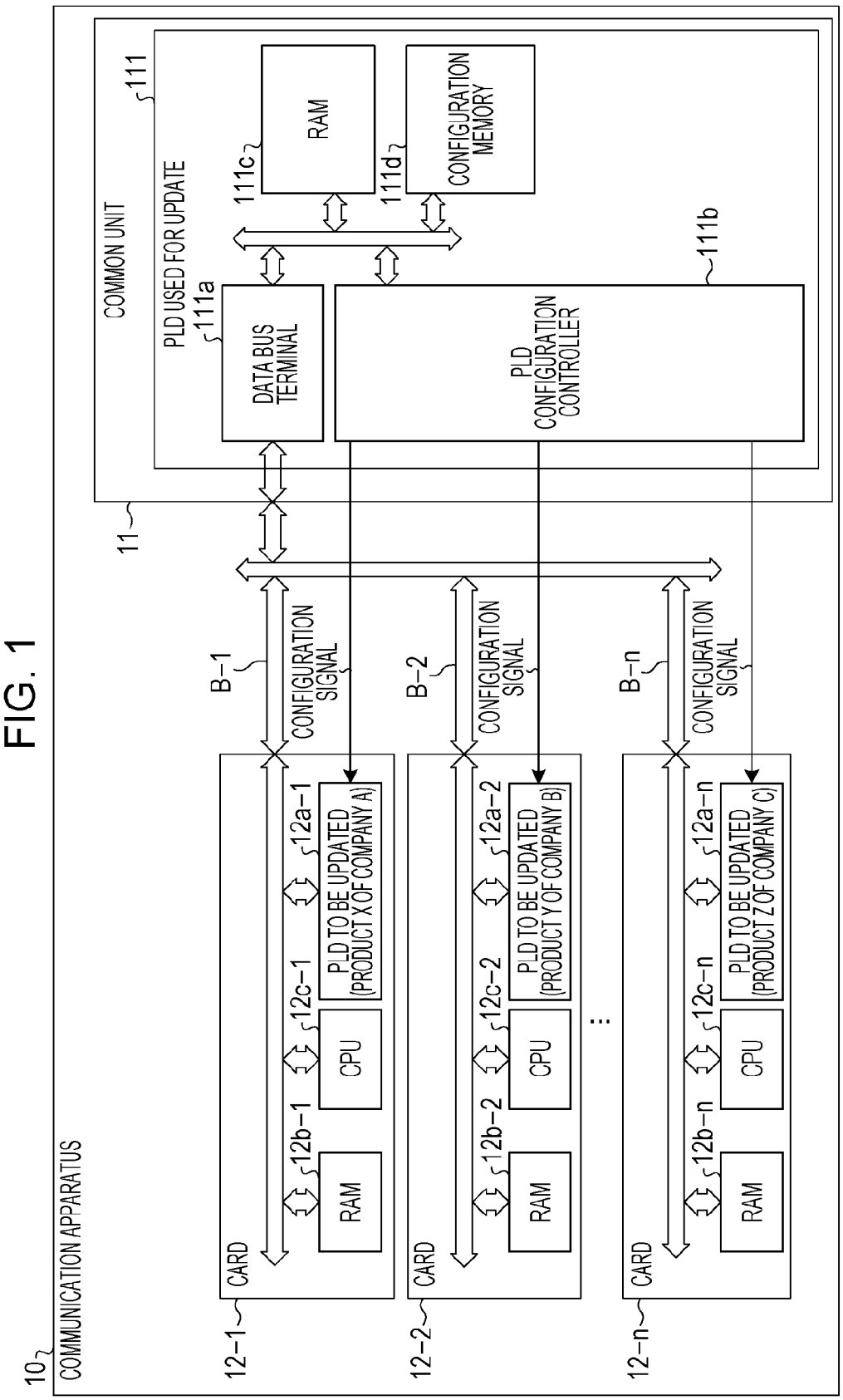
FIG. 1 is a diagram illustrating the configuration of a communication apparatus.

First, the configuration of a communication apparatus according to one embodiment disclosed in the present application will be described. FIG. 1 is a diagram illustrating the configuration of a communication apparatus 10. As illustrated in FIG. 1, the communication apparatus 10 according to the present embodiment includes a common unit 11 and n (n is a natural number) number of cards, 12-1, 12-2, . . . , and 12-n. The common unit 11 and the cards 12-1, 12-2, . . . , and 12-n are connected to each other through data buses B-1, B-2, . . . , and B-n, respectively. The common unit 11 includes a PLD 111 used for update (hereafter simply referred to as "the PLD 111") serving as a device used for update. The PLD 111 is, for example, a field-programmable gate array (FPGA) but may be a complex programmable logic device (CPLD) or the like.

The PLD 111 includes a data bus terminal 111a, a PLD configuration controller 111b, a RAM 111c, and a configuration memory 111d. These components are connected together in such a manner that signals or data can be inputted or outputted in one or both directions. The data bus terminal 111a terminates the data buses B-1, B-2, . . . , and B-n corresponding to the cards 12-1, 12-2, . . . , and 12-n, respectively. Based on a configuration signal, the PLD configuration controller 111b updates configuration memories included in the PLDs to be updated of the cards 12-1, 12-2, . . . , and 12-n. The RAM 111c temporarily stores circuit data received from the PLDs to be updated included in the cards 12-1, 12-2, . . . , and 12-n through the data buses B-1, B-2, . . . , and B-n. The configuration memory 111d stores the circuit data acquired from the cards 12-1, 12-2, . . . , and 12-n and to be used to update the PLD 111.

Note that the circuit data for the PLDs to be updated is temporarily used in the common unit 11. For this reason, the common unit 11 may use a volatile memory (e.g., the RAM 111c) as a memory for storing the circuit data for the PLDs to be updated (e.g., circuit data X for a card) and therefore may not include a non-volatile memory.

The card 12-1 includes a PLD 12a-1 to be updated (hereafter simply referred to as "the PLD 12a-1"), a RAM 12b-1, and a CPU 12c-1. These components are connected together in such a manner that signals or data can be inputted or outputted in one or both directions. In the present embodiment, the PLD 12a-1 is a product X of a manufacturer A. The PLD 12a-1 is an integrated circuit which can be updated after manufactured, and includes a configuration memory. The configuration memory, not illustrated in the figures, included in the PLD 12a-1 is referred to as "the internal configuration memory". The internal configuration memory stores circuit data for the PLD 12a-1. This circuit data is rewritten based on a configuration signal received from the PLD configuration controller 111b. For example, if the configuration signal includes circuit data X and a control signal, the circuit data in the internal configuration memory is rewritten, that is, circuit data A for updating the PLD 111 is replaced with the circuit data X for updating the PLD 12a-1.

In updating the PLD 111, the RAM 12b-1 temporarily stores the circuit data A to be outputted to the PLD 111; in updating the PLD 12a-1, it temporarily stores the circuit data X to be outputted to the PLD 111. Subsequently, the circuit data A is outputted to the PLD 111 and stored in the configuration memory 111d. The circuit data X is outputted to the PLD 111 and stored in the RAM 111c. The CPU 12c-1 centrally controls the card 12-1. For example, the CPU 12c-1 performs functions corresponding to the purpose of the card 12-1 on the basis of an instruction from the PLD 12a-1 which has been updated based on the circuit data X.

While the configuration of the card 12-1 of the multiple cards mounted in the shelf of the communication apparatus 10 has been described as a representative, the configurations of the other cards, 12-2, . . . , and 12-n, are similar to that of the card 12-1. Accordingly, similar components are given reference signs having the same last character and will not be described in detail.

Figure 2:
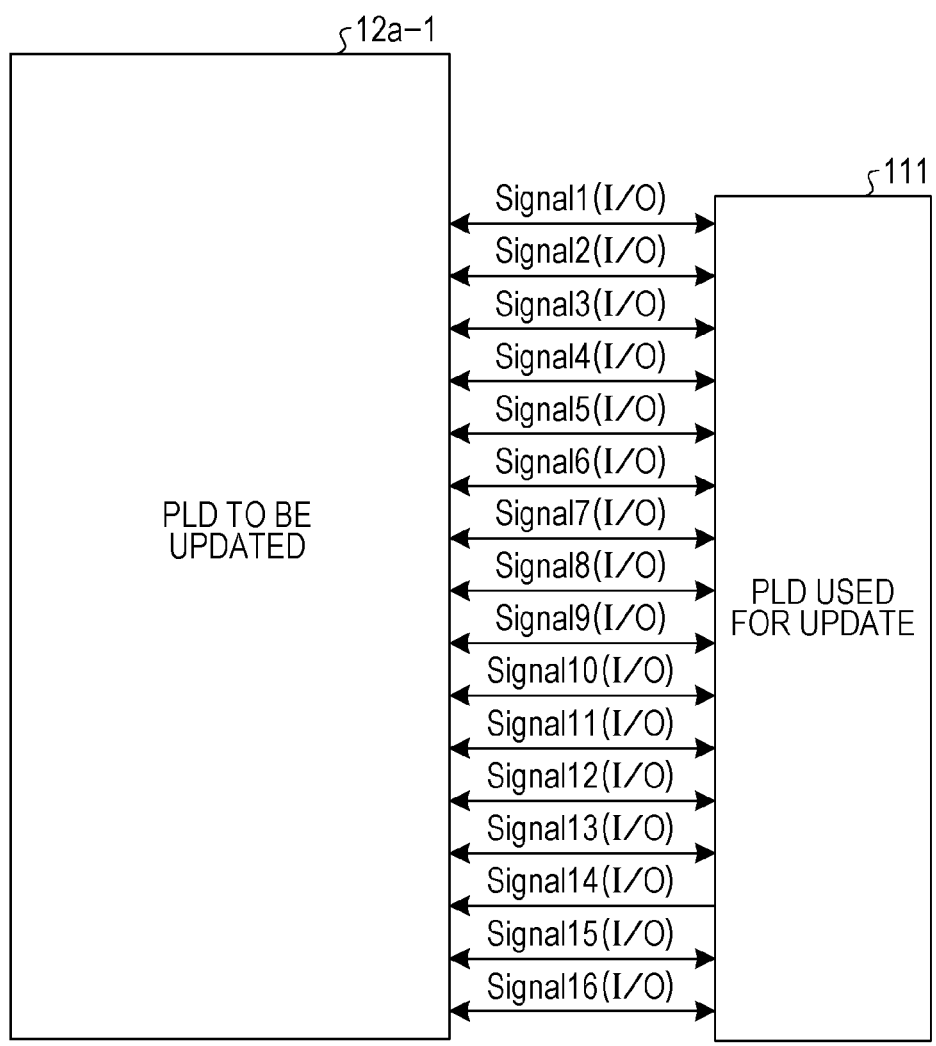
FIG. 2 is a diagram illustrating an example configuration of configuration signals which are inputted or outputted between a common unit and each card.

Next, the configuration of the configuration signal will be described. FIG. 2 is a diagram illustrating an example configuration of configuration signals inputted or outputted between the common unit 11 and the cards 12-1, 12-2, . . . , and 12-n. As illustrated in FIG. 2, for example, 16 signal lines are routed between the PLD 111 of the common unit 11 and the PLD 12a-1 of the card 12-1 so that 16 types of signals can be inputted or outputted in both directions. Thus, the common unit 11 can adapt to any cards manufactured by any manufacturers.

Figure 3:
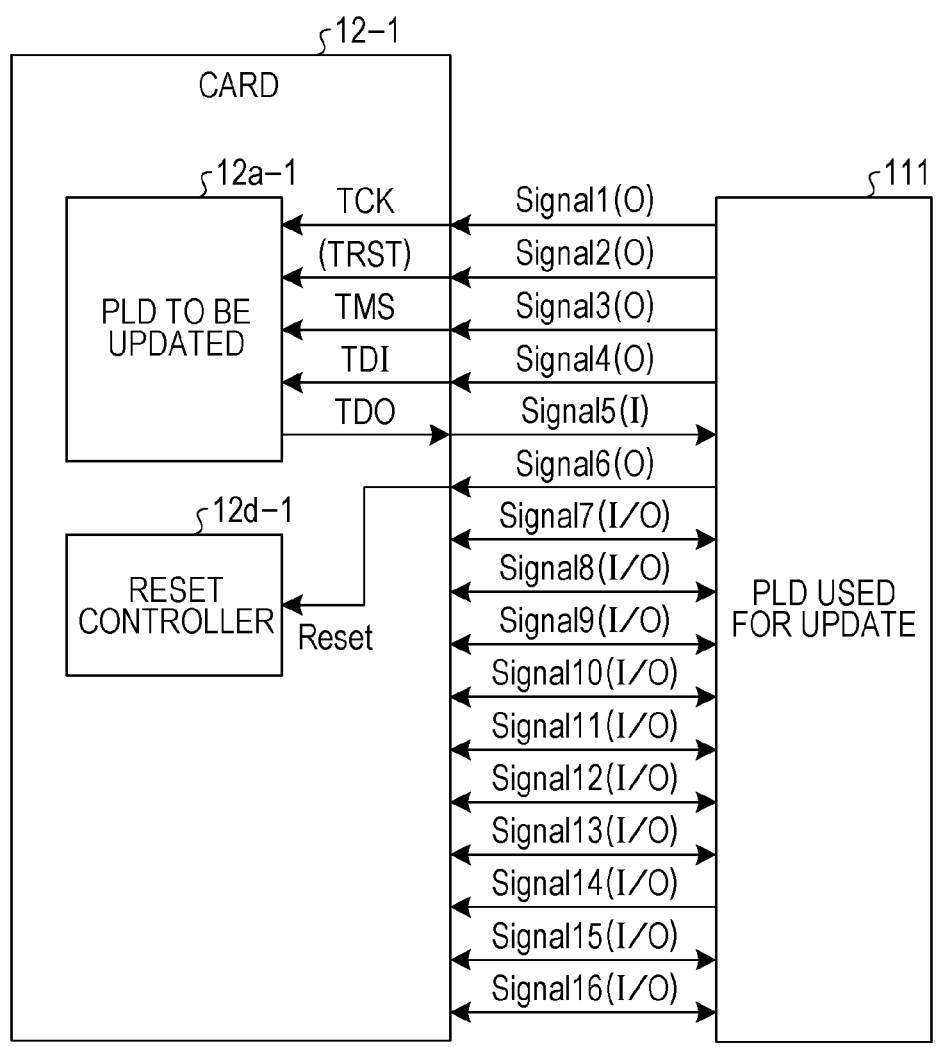
FIG. 3 is a diagram illustrating an example of signals assigned to signal lines as configuration signals.

Each signal line is assigned a function and an input/output direction corresponding to the PLD and used. FIG. 3 is a diagram illustrating an example of signals assigned to the signal lines as configuration signals. The signals illustrated in FIG. 3 are signals for a boundary scan test standardized by a standard (JTAG: Joint Test Action Group) of the Institute of Electrical and Electronic Engineers (IEEE) 1149.1. These signals are called the Test Access Port (TAP) and, as illustrated in FIG. 3, include signals Test Clock (TCK), Test Reset (TRST), Test Mode Select (TMS), and Test Data In (TDI) outputted from the PLD 111 and a signal Test Data Out (TDO) inputted to the PLD 111. Reset is a reset signal inputted to a reset controller 12d-1 of the card 12-1. After the PLD 12a-1 is updated, the card 12-1 is reset by this reset signal.

TCK is a clock input signal, and the other signals are captured at the rising edge of the signal TCK. TRST is a reset signal inputted to a TAP controller, which is a state machine having 16 states controlled by the signal TMS. TMS is a signal for controlling the state transition of the TAP controller. TDI is an input signal of data (e.g., circuit data). TDO is an output signal of data (e.g., circuit data). Reset is a reset signal inputted to the reset controller 12d-1 of the card 12-1. After updating the PLD 12a-1, the card 12-1 is reset by this reset signal.

Figure 4:
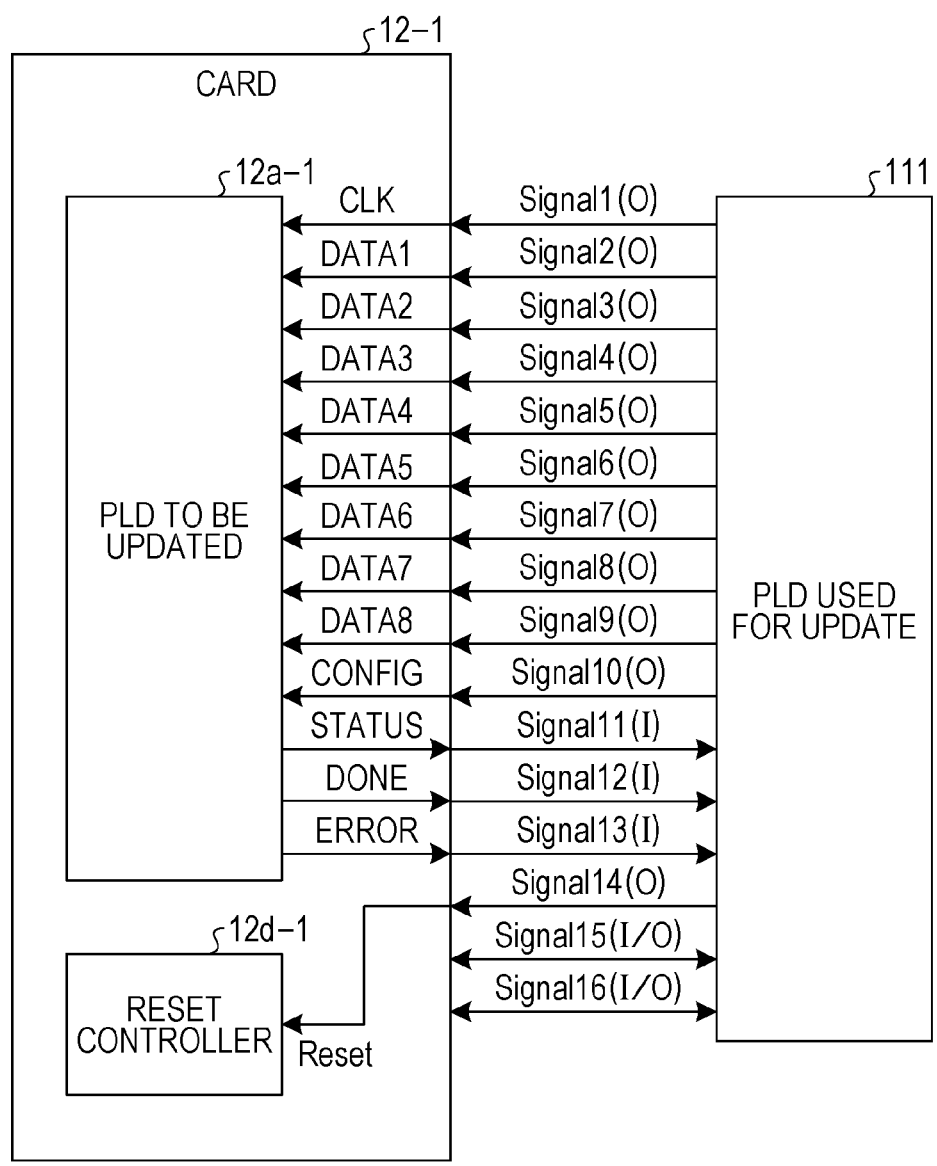
FIG. 4 is a diagram illustrating another example of signals assigned to signal lines as configuration signals.

FIG. 4 is a diagram illustrating another example of signals assigned to the signal lines as configuration signals. The signals illustrated in FIG. 4 are signals used in the Fast Passive Parallel Mode (8-bit parallel data), which is one of FPGA rewriting methods. As illustrated in FIG. 4, these signals include signals Clock (CLK), DATA 1 to 8, CONFIG, and Reset outputted from the PLD 111 and signals STATUS, DONE, and ERROR inputted to the PLD 111.

CLK is a clock input signal, and the other signals are captured at the rising edge of the signal CLK. DATA 1 to 8 are 8-bit data (e.g., circuit data) signals. CONFIG is a signal for controlling start of update of the PLD 12a-1. STATUS is a signal for outputting the status of the PLD 12a-1 and notifies the PLD 111 that preparation of the update is complete, or the like. DONE is a signal for outputting the completion of the update and notifies the PLD 111 that the update of the PLD 12a-1 is complete, or the like. ERROR is a signal for outputting a cyclic redundancy check (CRC) error and is assigned to monitor the normality of the data. Reset is a reset signal inputted to the reset controller 12d-1 of the card 12-1. After updating the PLD 12a-1, the card 12-1 is reset by this reset signal.

While the configuration of the signals between the card 12-1 of the cards 12-1, 12-2, . . . , and 12-n and the PLD 111 has been described as a representative, the same applies to the other cards, 12-2, . . . , and 12-n.

Next, there will be described operations of the communication apparatus 10 according to the present embodiment. In these operations, the communication apparatus 10 replaces the circuit data A of the card 12-1 with the circuit data X and then replaces the circuit data B and C of the cards 12-2 and 12-n with circuit data Y and Z, respectively. Such a circuit data rewriting process is started in response to a command from the administrator or an instruction from a monitor.

Figure 5:
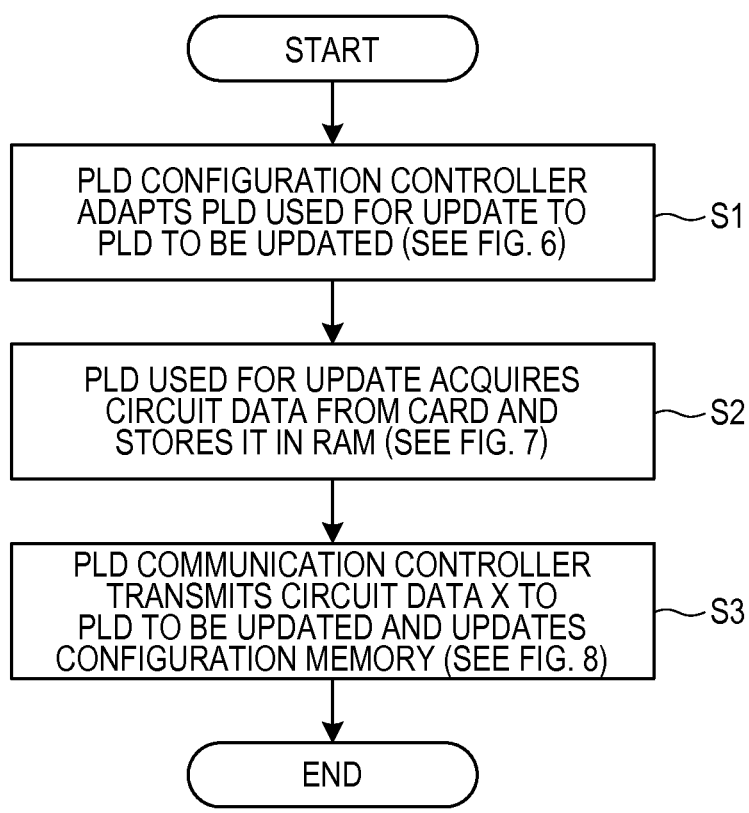
FIG. 5 is a flowchart illustrating operations of the communication apparatus.
Figure 6:
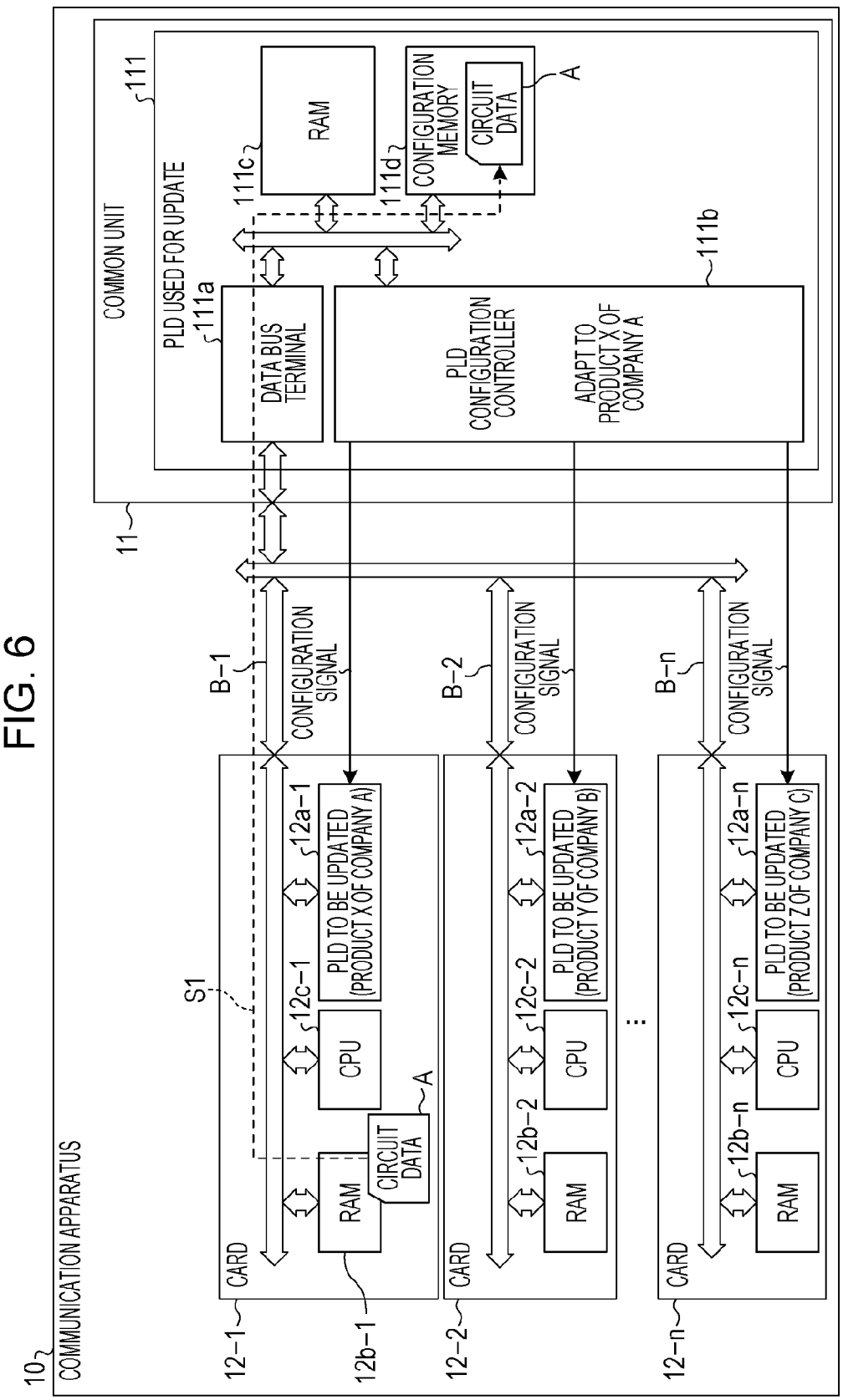
FIG. 6 is a diagram illustrating an aspect where circuit data A is transmitted from the RAM of a card to the configuration memory of a PLD used for update in a first embodiment.

FIG. 5 is a flowchart illustrating the operations of the communication apparatus 10. In S1, the PLD configuration controller 111b adapts the PLD 111 to the PLD 12a-1 of the card 12-1 which holds the circuit data A. FIG. 6 is a diagram illustrating an aspect where the circuit data A is transmitted from the RAM 12b-1 of the card 12-1 to the configuration memory 111d of the PLD 111. As illustrated in FIG. 6, the circuit data A is stored in the RAM 12b-1. Note that the circuit data A may be held by the card 12-1 in advance or acquired from an external apparatus before rewritten.

Specifically, based on an instruction from the CPU 12c-1, the card 12-1 transmits the circuit data A in the RAM 12b-1 to the PLD 111 through the data bus B-1. The PLD 111 receives the circuit data A and stores it in the configuration memory 111d. Subsequently, the PLD configuration controller 111b of the PLD 111 updates the PLD 111 itself so that the PLD 111 of the common unit 11 adapts to the PLD 12a-1 of the card 12-1. Thus, the PLD 111 is placed in a state similar to the state of the PLD 12a-1 (adapts to the product X of the company A).

Figure 7:
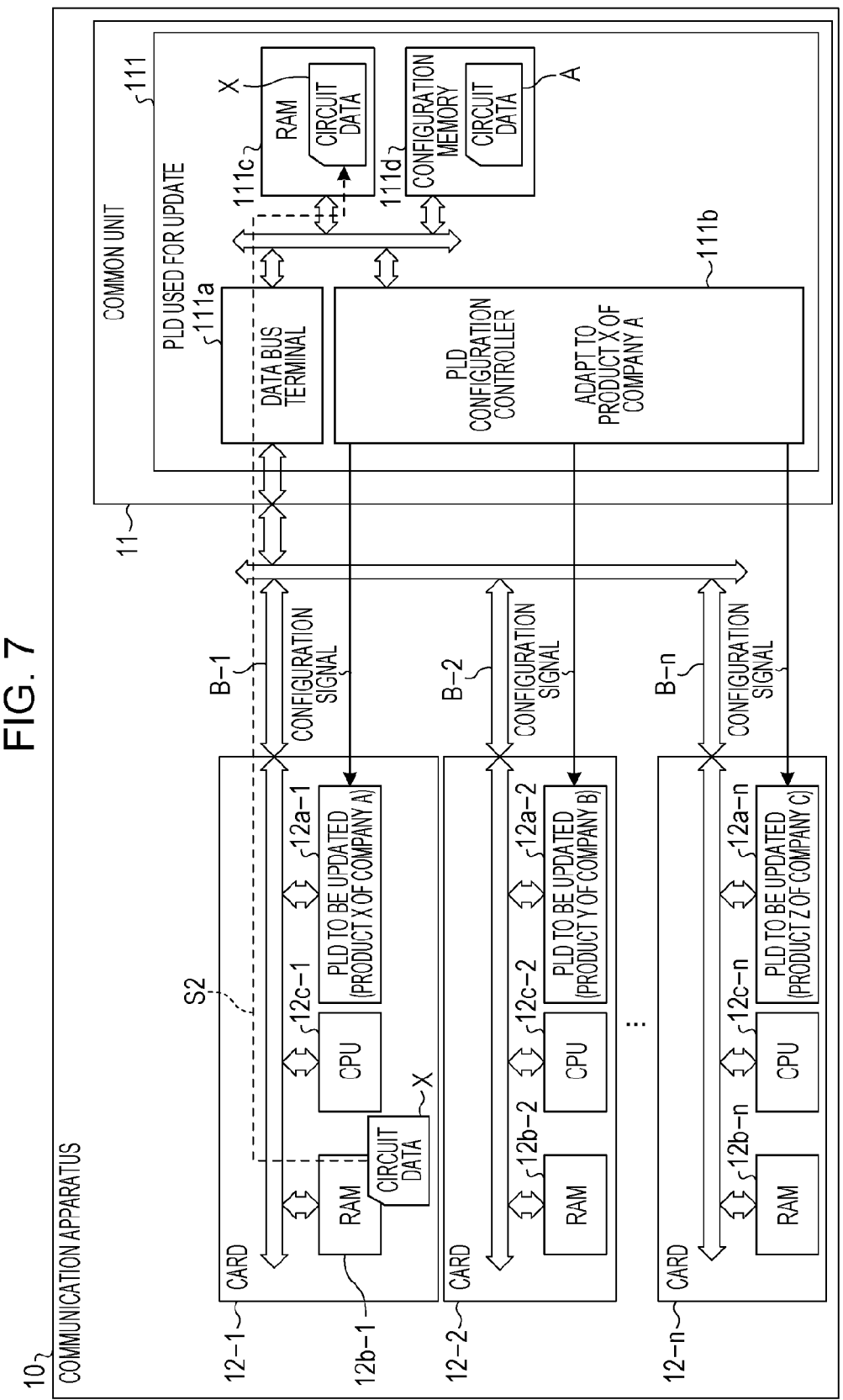
FIG. 7 is a diagram illustrating an aspect where circuit data X is transmitted from the RAM of the card to the RAM of the PLD used for update in the first embodiment.

In S2, the PLD 111 of the common unit 11 acquires new circuit data X corresponding to the circuit data A from the card 12-1 and stores it in the RAM 111c. FIG. 7 is a diagram illustrating an aspect where the circuit data X is transmitted from the RAM 12b-1 of the card 12-1 to the RAM 111c of the PLD 111. As illustrated in FIG. 7, the circuit data X stored in the RAM 12b-1 is inputted to the PLD 111 through the data bus B-1 and the data bus terminal 111a and then stored in the RAM 111c.

Figure 8:
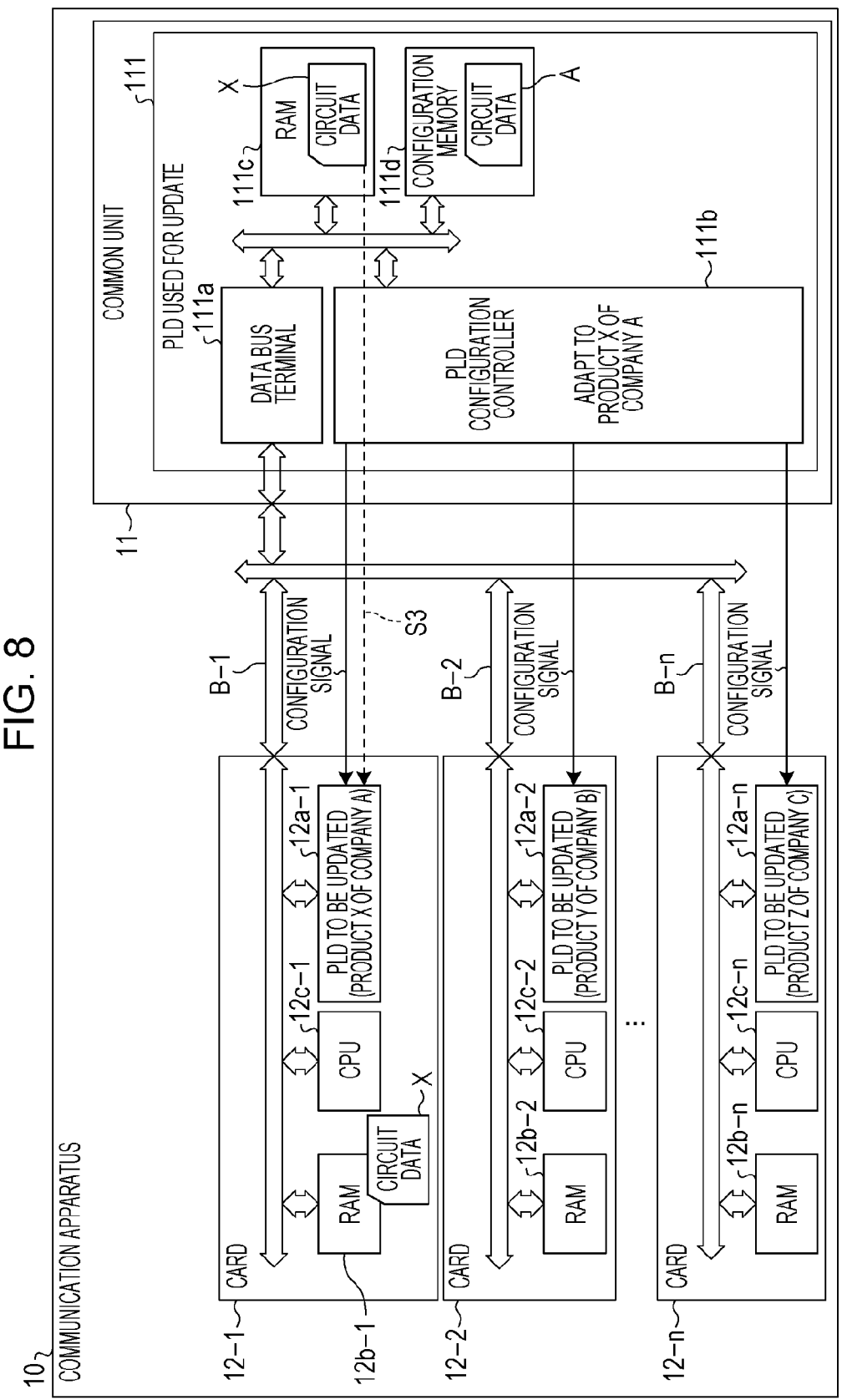
FIG. 8 is a diagram illustrating an aspect where the circuit data X is transmitted from the RAM of the PLD used for update to a PLD to be updated in the first embodiment.

In S3, the PLD configuration controller 111b of the PLD 111 transmits the new circuit data X, stored in the RAM 111c in S2, to the PLD 12a-1 of the card 12-1. FIG. 8 is a diagram illustrating an aspect where the circuit data X is transmitted from the RAM 111c of the PLD 111 to the PLD 12a-1. The PLD 12a-1 receives the circuit data X and replaces the circuit data in the internal configuration memory thereof with the circuit data X. Thus, the card 12-1 is enabled to perform the function thereof using the new circuit data X.

Figure 9:
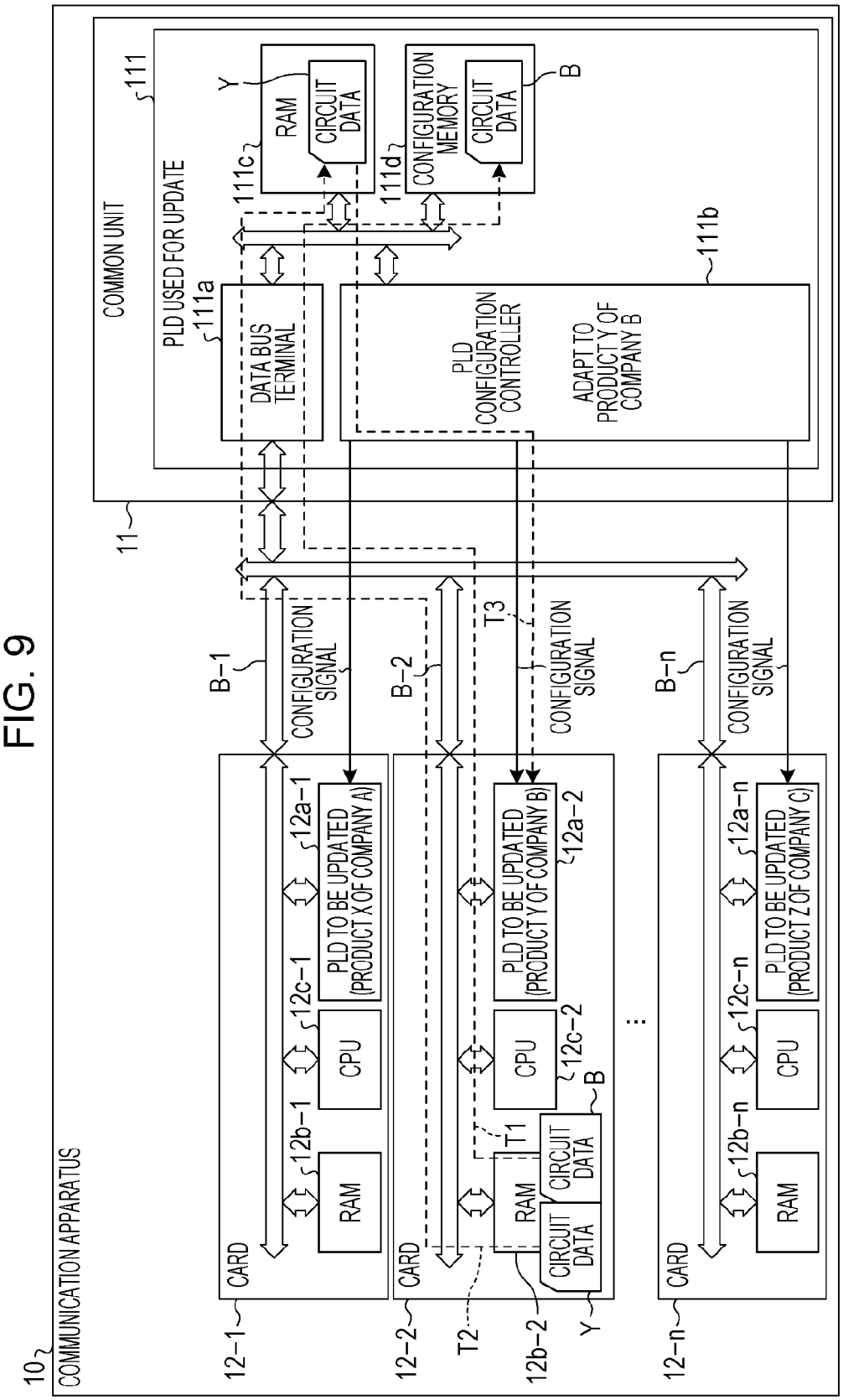
FIG. 9 is a diagram illustrating a circuit data rewriting process which is performed on another PLD to be updated according to the first embodiment.
Figure 10:
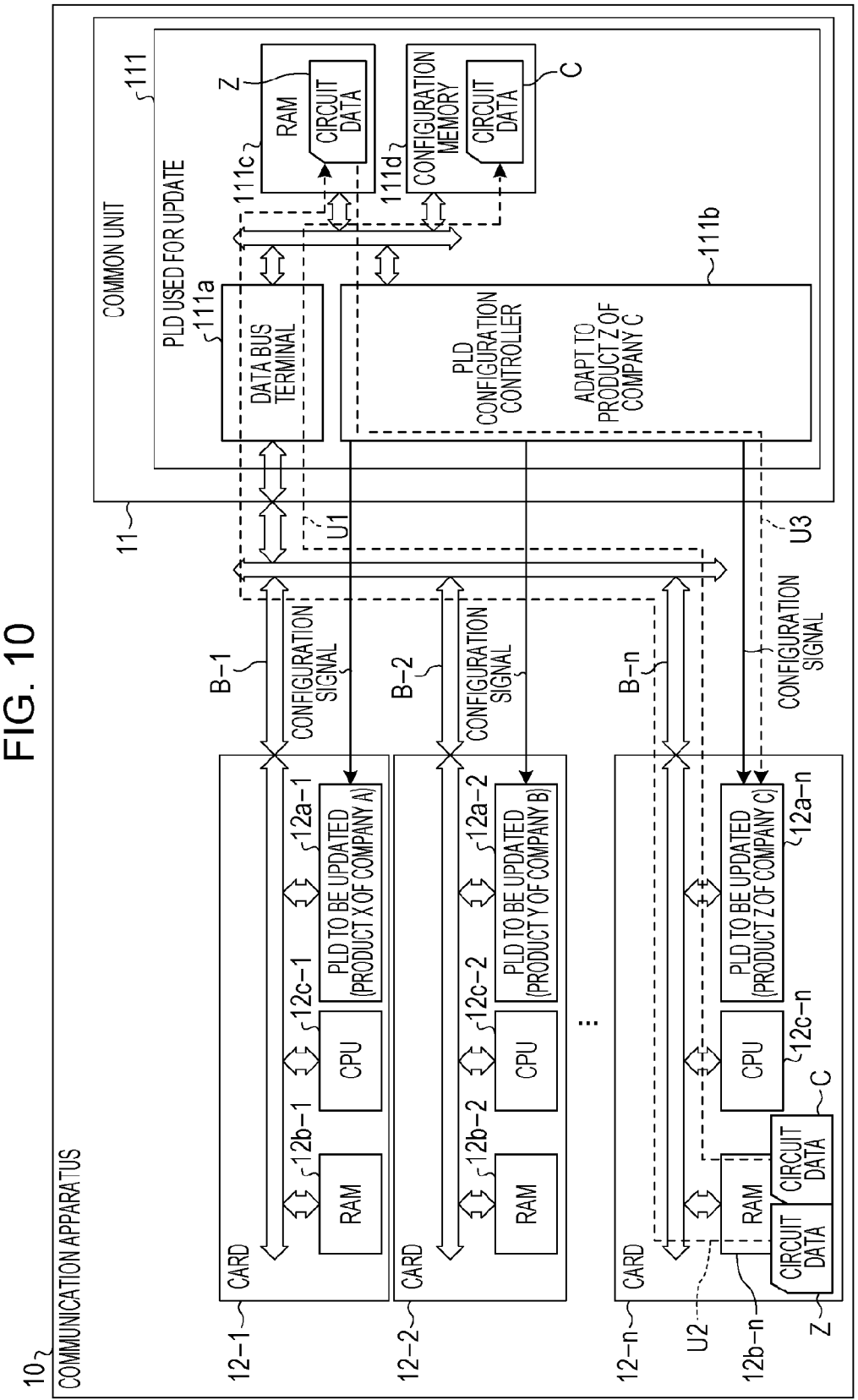
FIG. 10 is a diagram illustrating a circuit data rewriting process which is performed on yet another PLD to be updated according to the first embodiment.

While there has been described the example in which the circuit data of the PLD 12a-1 of the card 12-1 is rewritten, that is, the circuit data A is replaced with the circuit data X, the circuit data of the other cards, 12-2 and 12-n, can also be rewritten through a similar process. FIG. 9 is a diagram illustrating a circuit data rewriting process which is performed on another PLD to be updated, 12a-2. FIG. 10 is a diagram illustrating a circuit data rewriting process which is performed on yet another PLD to be updated, 12a-n. These circuit data rewriting processes are performed, for example, when rewriting of the circuit data of the PLDs 12a-2 and 12a-n is requested by the administrator or monitor.

FIGS. 9 and 10 are similar to FIGS. 6 to 8, which have been referred to in the description of the process related to the card 12-1, the card to be updated in FIGS. 9 and 10 is different from FIG. 6. Accordingly, the common operations are given reference signs having the same last character and will not be described in detail. Specifically, operations T1 to T3 in FIG. 9 correspond to operations S1 to S3 illustrated in FIGS. 6 to 8. Similarly, operations U1 to U3 in FIG. 10 correspond to operations S1 to S3 illustrated in FIGS. 6 to 8.

As seen above, the communication apparatus 10 has the PLD 111 used for update in the common unit 11 and the PLDs 12a-1, 12a-2, . . . , and 12a-n to be updated in the cards 12-1, 12-2, . . . , and 12-n. The PLD 111 includes the PLD configuration controller 111b, the RAM 111c, and the configuration memory 111d. The configuration memory 111d acquires the circuit data A for updating the PLD 111 from the card 12-1, includes the PLD 12a-1, and updates the PLD 111 using the circuit data A. The RAM 111c acquires, from the card 12-1, the circuit data X for updating the PLD 12a-1 and stores it. The PLD configuration controller 111b acquires the circuit data X stored in the RAM 111c and updates the PLD 12a-1 using the circuit data X.

That is, in updating the target device, the communication apparatus 10 once updates another device using the existing circuit data A, then acquires the new circuit data X from the other device and updates the target device using the new circuit data. As seen above, the communication apparatus 10 can updates the devices in the cards mounted thereon (for example, the PLDs 12a-1, 12a-2, . . . , and 12a-n) through software processing by the processors in the simple configuration. In other words, the communication apparatus 10 is small in mounting area and low cost and can update the PLDs, which have been difficult to update in a field (client site) thus far due to the functional limitations. Further, the communication apparatus 10 can adapt to a PLD to be updated whose interface or updating method is new. That is, by using a PLD as a device used for update, the communication apparatus 10 can change the interface or rewriting method so that the interface or rewriting method adapts to the new PLD to be updated. Thus, the communication apparatus 10 can rewrite the existing circuit data to the new circuit data even in a field.

First Modification

Figure 11:
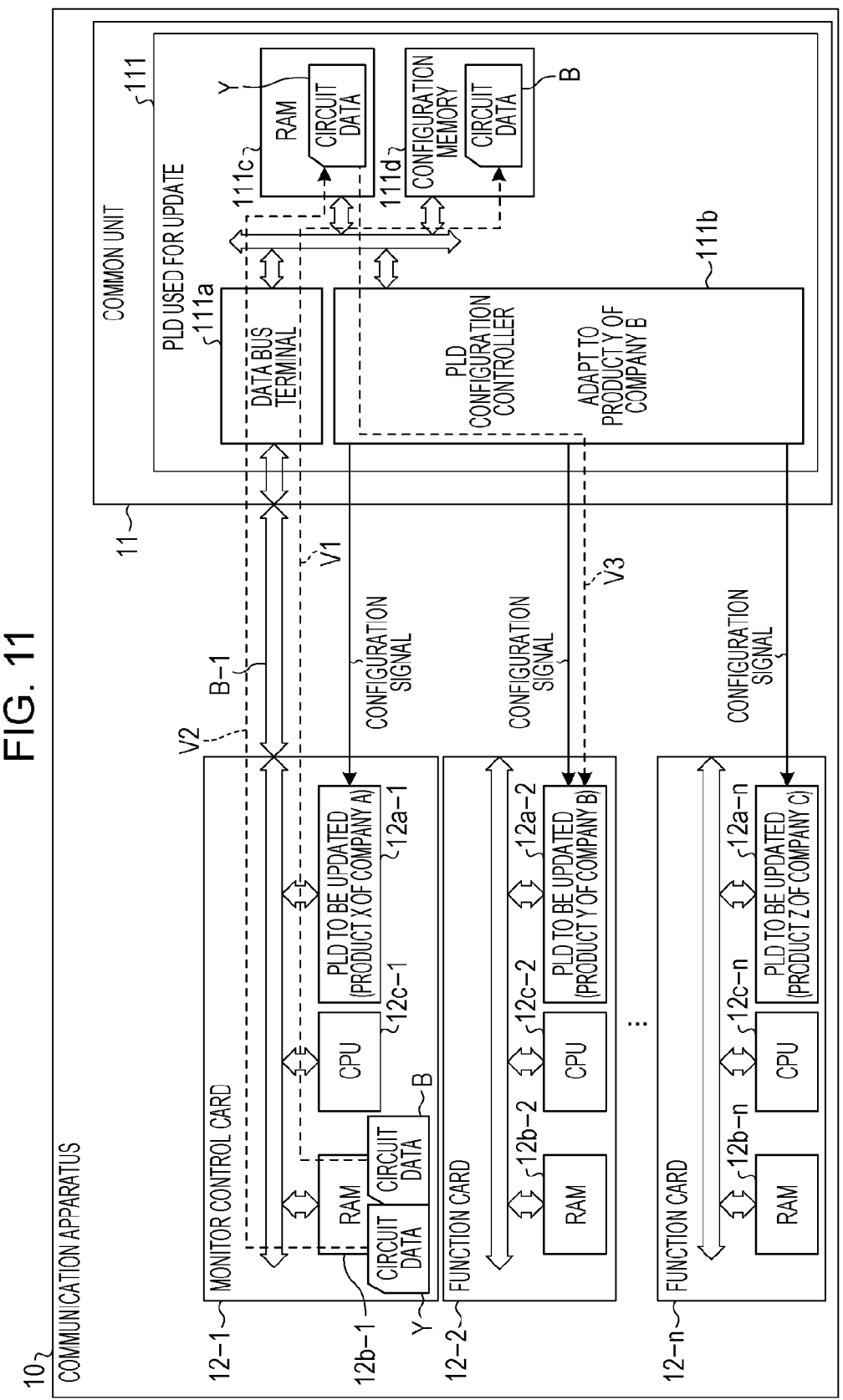
FIG. 11 is a diagram illustrating a circuit data rewriting process performed by a communication apparatus according to a first modification.

Next, referring to FIG. 11, a first modification, which is a modification of the first embodiment, will be described. FIG. 11 is a diagram illustrating a circuit data rewriting process performed by a communication apparatus 10 according to the first modification. FIG. 11 is similar to FIG. 9, which has been referred to in the description of the operation related to the card 12-2, except that a data bus is connected only to a monitoring/control card. Accordingly, similar operations are given reference signs having the same last character and will not be described in detail. Specifically, operations V1 to V3 in FIG. 11 correspond to operations T1 to T3 illustrated in FIG. 9.

As illustrated in FIG. 11, the first modification differs from the first embodiment in the method for connecting a data bus. Specifically, in the first embodiment, the n number (n is a natural number) of data buses, B-1, B-2, . . . , and B-n, are connected to the corresponding cards 12-1, 12-2, . . . , and 12-n. On the other hand, in the first modification, whether a data bus is connected to a card depends on the purpose of the card. Specifically, a data bus B-1 is connected only to a card 12-1 for monitoring and control, while no data bus is connected to the other function cards, 12-2, . . . , and 12-n.

Figure 12:
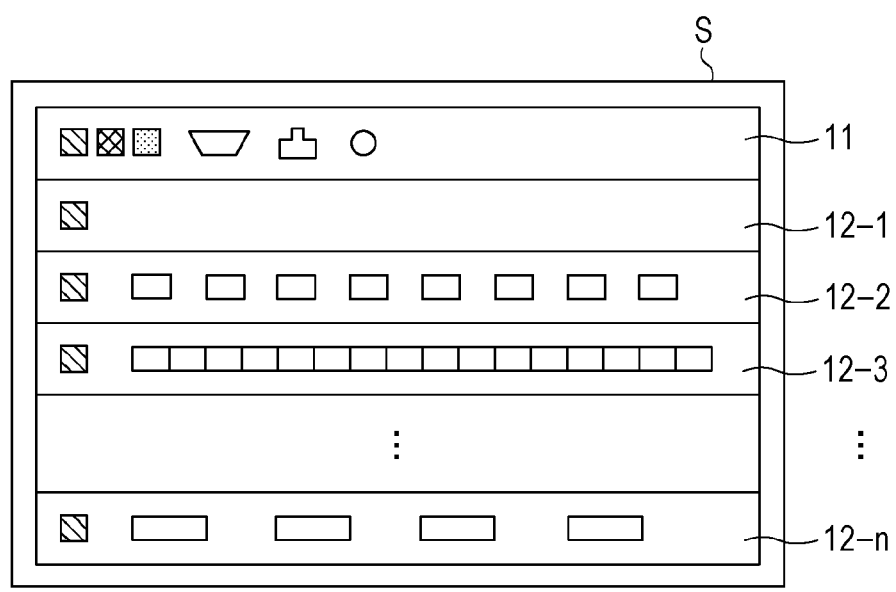
FIG. 12 is an appearance view of a shelf housing a common unit and multiple cards in the first modification.

Detailed description will be made below while focusing on the difference between the first modification and the first embodiment. In the communication apparatus 10, the monitoring/control card 12-1 is mounted in the second stage of the shelf for housing the cards, 12-1, 12-2, . . . , and 12-n. FIG. 12 is an appearance view of a shelf S housing the common unit 11 and the cards 12-1, 12-2, . . . , and 12-n in the first modification. As illustrated in FIG. 12, the common unit 11 is mounted in the uppermost stage of the shelf S, and the monitoring/control card 12-1, which has no communication interface, is mounted in the second stage thereof. The function cards 12-2, . . . , and 12-n, with which the communication apparatus 10 performs functions, are mounted in the third and lower stages thereof.

In the first modification, the data bus B-1 is connected only to a particular card of the cards 12-1, 12-2, . . . , and 12-n mounted in the shelf S. Thus, only the particular card is connected to the PLD 111 of the common unit 11. The monitoring/control card 12-1, which is responsible for internal monitoring and control of the communication apparatus 10, is designated as the particular card. The monitoring/control card 12-1 stores all circuit data (for example, circuit data A, X, B, Y, C, and Z) of the function cards 12-2, . . . , and 12-n and causes the common unit 11 to perform a circuit data rewriting process using such circuit data. Thus, the monitoring/control card 12-1 rewrites the circuit data stored in the configuration memories of the PLDs 12a-2, . . . , and 12a-n through the PLD 111.

In the communication apparatus 10 according to the first embodiment, the data buses B-1, B-2, . . . , and B-n are connected to the corresponding cards (see FIG. 1). Thus, the number of signals or bridge devices is increased. On the other hand, in the communication apparatus 10 according to the first modification, one card, 12-1, of the cards 12-1, 12-2, . . . , and 12-n is connected with the data bus B-1, which inputs or outputs the circuit data B and Y between the one card and the PLD 111. That is, in the communication apparatus 10 according to the first modification, the role of controlling the rewriting function of the common unit 11 is concentrated on the monitoring/control card 12-1. Thus, the number of data buses is reduced. Further, in the communication apparatus 10 according to the first modification, the cards 12-2, . . . , and 12-n, to which no data bus is connected, do not have to include a bridge device for data bus. As a result, the number of signals or bridge devices is reduced.

Further, the process of controlling the PLD 111 of the common unit 11 is centrally managed by the single card. Accordingly, an arbitration process such as the determination of priority does not have to be performed, compared to in the first embodiment, where the multiple cards perform control. Thus, the degree of difficulty of software processing by the processor is reduced. As a result, the cost can be reduced in terms of the mounting surface, the number of parts, software, and the like.

Second Modification

Figure 13:
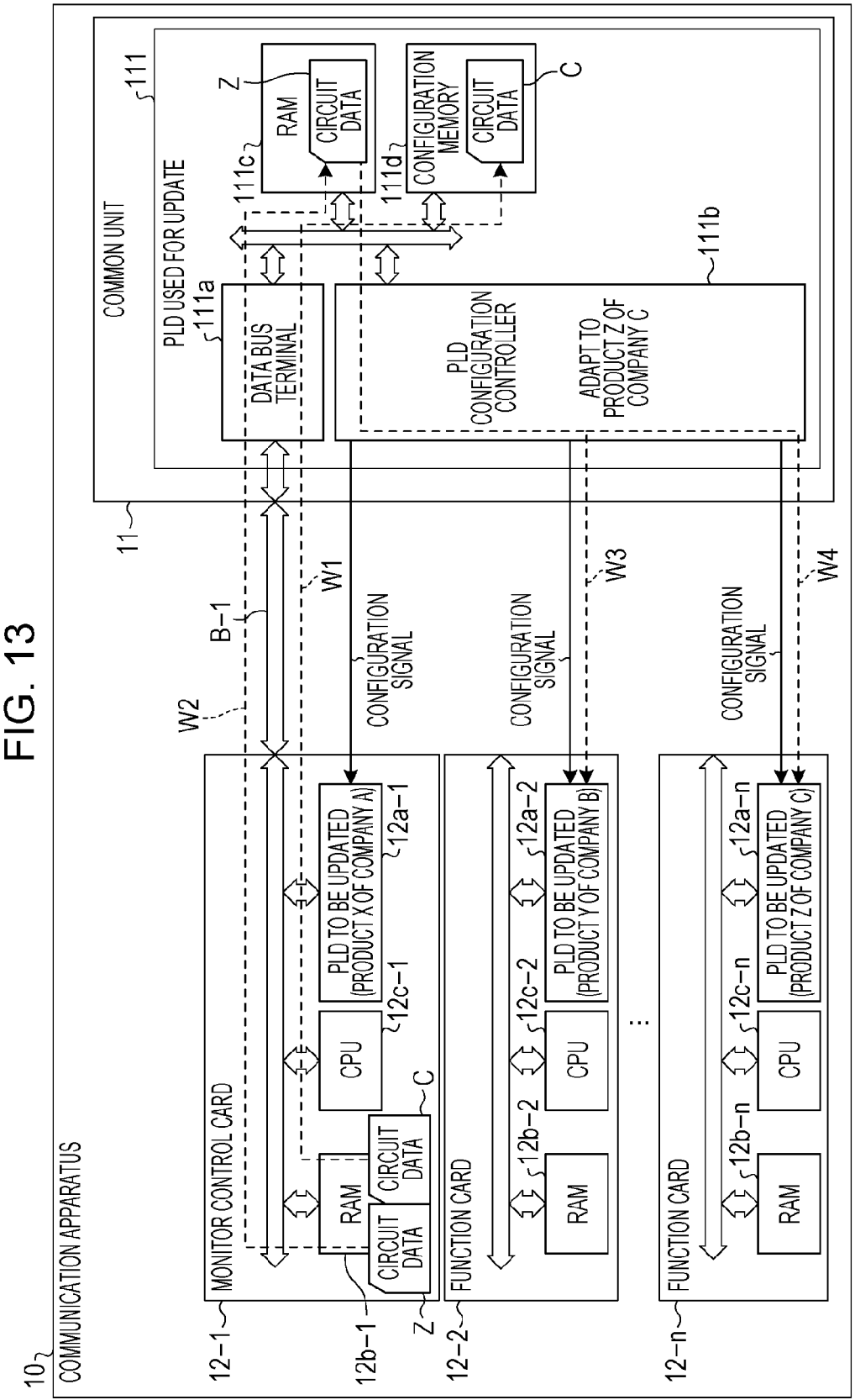
FIG. 13 is a diagram illustrating a circuit data rewriting process performed by a communication apparatus according to a second modification.

Next, referring to FIG. 13, a second modification, which is a further modification of the first embodiment, will be described. FIG. 13 is a diagram illustrating a circuit data rewriting process performed by a communication apparatus 10 according to the second modification. FIG. 13 is similar to FIG. 11, which has been referred to in the described of the first modification, except that the circuit data of multiple cards is simultaneously rewritten. Accordingly, the common operations are given reference signs having the same last character and will not be described in detail. Specifically, operations W1, W2, W3, and W4 in FIG. 13 correspond to operations V1, V2, and V3 shown in FIG. 11.

As illustrated in FIG. 13, the second modification differs from the first modification in the method for updating a PLD to be updated. Specifically, in the first modification, the circuit data in the PLDs 12a-2, . . . , and 12a-n of the function cards 12-2, . . . , and 12-n is rewritten individually. On the other hand, in the second modification, the function cards 12-2, . . . , and 12-n are of the same type and therefore the circuit data in the PLDs 12a-2, . . . , and 12a-n can be simultaneously rewritten.

In the communication apparatus 10, the PLD configuration controller 111b outputs circuit data Z stored in the RAM 111c to the cards 12-2, . . . , and 12-n in parallel. The PLD configuration controller 111b acquires parallel-outputted circuit data Z from the RAM 111c and updates the PLDs 12a-2, . . . , and 12a-n of the cards 12-2, . . . , and 12-n in parallel using the circuit data Z.

If the communication apparatus 10 rewrites the circuit data in the function cards 12-2, . . . , and 12-n, starting from the function card 12-2 sequentially, it would take a long time until the update of all the cards is complete. This is particularly remarkable if the communication apparatus 10 includes many cards. For this reason, if the communication apparatus 10 includes multiple cards of the same type, the communication apparatus 10 performs circuit data rewriting processes on the function cards 12-2, . . . , and 12-n of the same type in parallel under the control of the monitoring/control card 12-1. Thus, as illustrated in FIG. 13, all the circuit data in the configuration memories of the PLDs 12a-2, . . . , and 12a-n of the cards 12-2, . . . , and 12-n is simultaneously replaced with the circuit data Z. As a result, the time taken to rewrite the circuit data of the PLDs of the entire apparatus is reduced.

Third Modification

Figure 14:
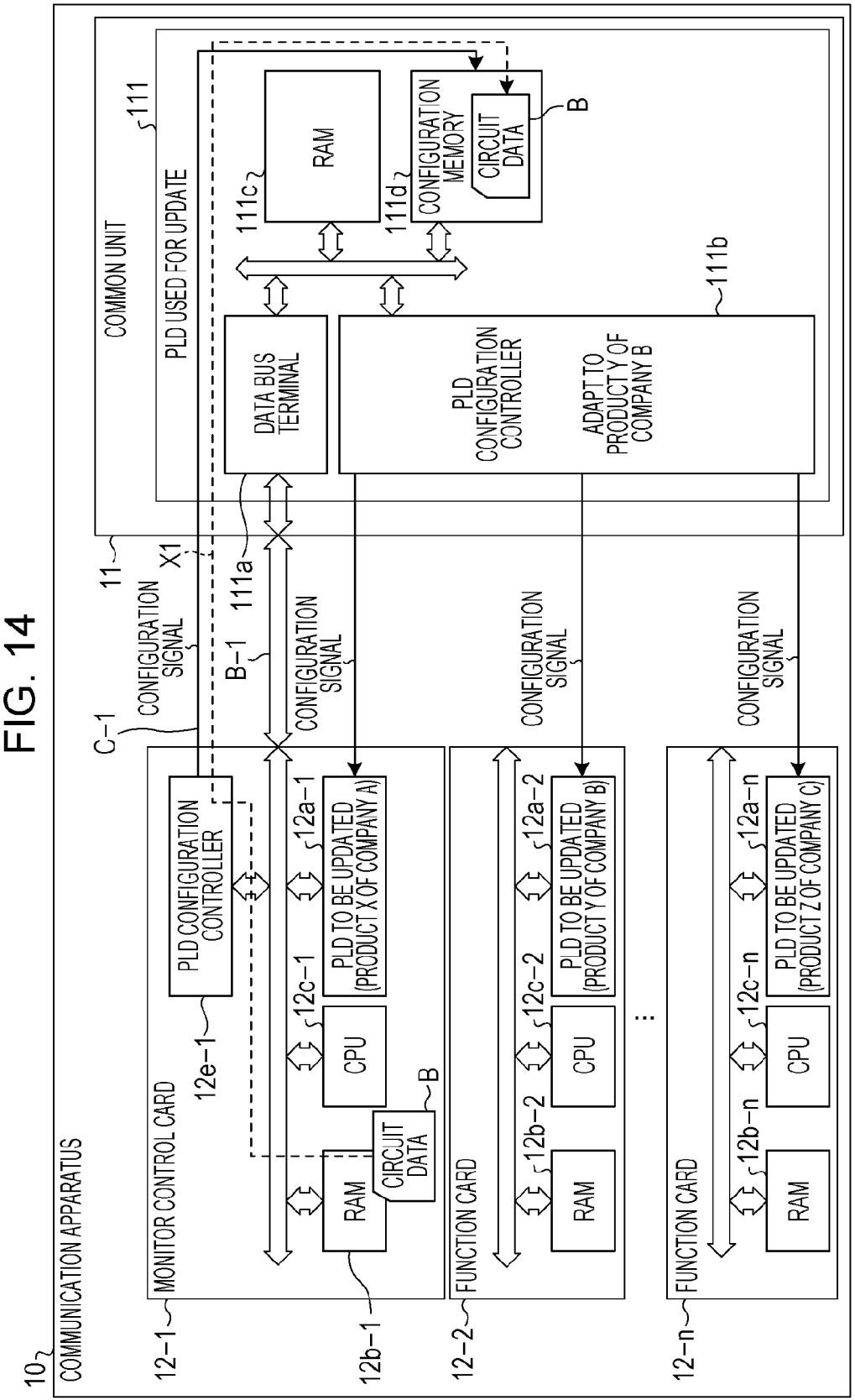
FIG. 14 is a diagram illustrating a circuit data rewriting process performed by a communication apparatus according to a third modification.

Next, referring to FIG. 14, a third modification, which is a modification of the first embodiment, will be described. FIG. 14 is a diagram illustrating a circuit data rewriting process performed by a communication apparatus 10 according to the third modification. FIG. 14 is similar to FIG. 9, which has been referred to in the description of the operation related to the card 12-2, except that a monitoring/control card 12-1 includes a PLD configuration controller 12e-1 for outputting a configuration signal (rewrite signal) to a common unit 11. Accordingly, the common operations are given reference signs having the same last character and will not be described in detail. Specifically, operation X1 in FIG. 14 corresponds to operation T1 illustrated in FIG. 9.

As illustrated in FIG. 14, the third modification differs from the first embodiment in the configuration of the monitoring/control card 12-1. Specifically, in the first embodiment, the circuit data in the configuration memory 111d is rewritten through the data bus B-2, which connects the card 12-2 and the common unit 11 (see T1 in FIG. 9). On the other hand, in the communication apparatus 10 according to the third modification, a signal line C-1 solely for a configuration signal, as well as a data bus B-1, is connected between the monitoring/control card 12-1 and the PLD 111 of the common unit 11. When transmitting or receiving circuit data, the signal line C-1 serves as a backup path for the data bus B-1. Thus, the communication apparatus 10 can update the configuration memory 111d through the signal line C-1.

As described above, in the communication apparatus 10 according to the third modification, the particular card rewrites the circuit data in the configuration memory 111d using a configuration signal. The monitoring/control card 12-1, which is responsible for internal monitoring/control of the apparatus, is preferably designated as the particular card.

There is a concern that if a failure, such as power shutdown, occurs during an update of the configuration memory 111d of the PLD 111 of the common unit 11, the PLD 111 may not be started normally after recovery from the failure. For this reason, in the communication apparatus 10 according to the third modification, of the cards 12-1, 12-2, . . . , and 12-n, the single card, 12-1, outputs the circuit data B to the PLD 111 through the signal line C-1 for rewriting circuit data, which is a signal line different from the data bus B-1. That is, the communication apparatus 10 according to the third modification additionally has the PLD configuration controller 12e-1 in the monitoring/control card 12-1 and thus rewrites the circuit data in the configuration memory 111d on the basis of a configuration signal outputted from the PLD configuration controller 12e-1.

Thus, even when a failure, such as power shutdown, occurs during an update of the configuration memory 111d, the communication apparatus 10 according to the third modification can restore the PLD 111 to a normal state shortly after recovering from the failure. Accordingly, the communication apparatus 10 can restart updating the PLDs 12a-1, 12a-2, . . . , and 12a-n easily and rapidly after the recovery. As a result, the reliability of the communication apparatus 10 is increased. Further, the communication apparatus 10 according to the third modification can adapt to even a card which has difficulty in transmitting circuit data through the data bus B-1 due to the type or specification of the card.

The respective configurations and operations of the embodiment and modifications thereof have been described above. Note that each of the communication apparatuses 10 according to the embodiment and modifications thereof may include any components unique to the other embodiment or modifications. Further, the embodiment and modifications thereof may be combined in any form, including combinations of two as well as three or more thereof. For example, the simultaneous rewriting function of the second modification may be applied to the first modification, as well as to the first embodiment and the third modification. Further, a single communication apparatus 10 may include all the components described in the first embodiment and the first to third modifications.

Figure 15:
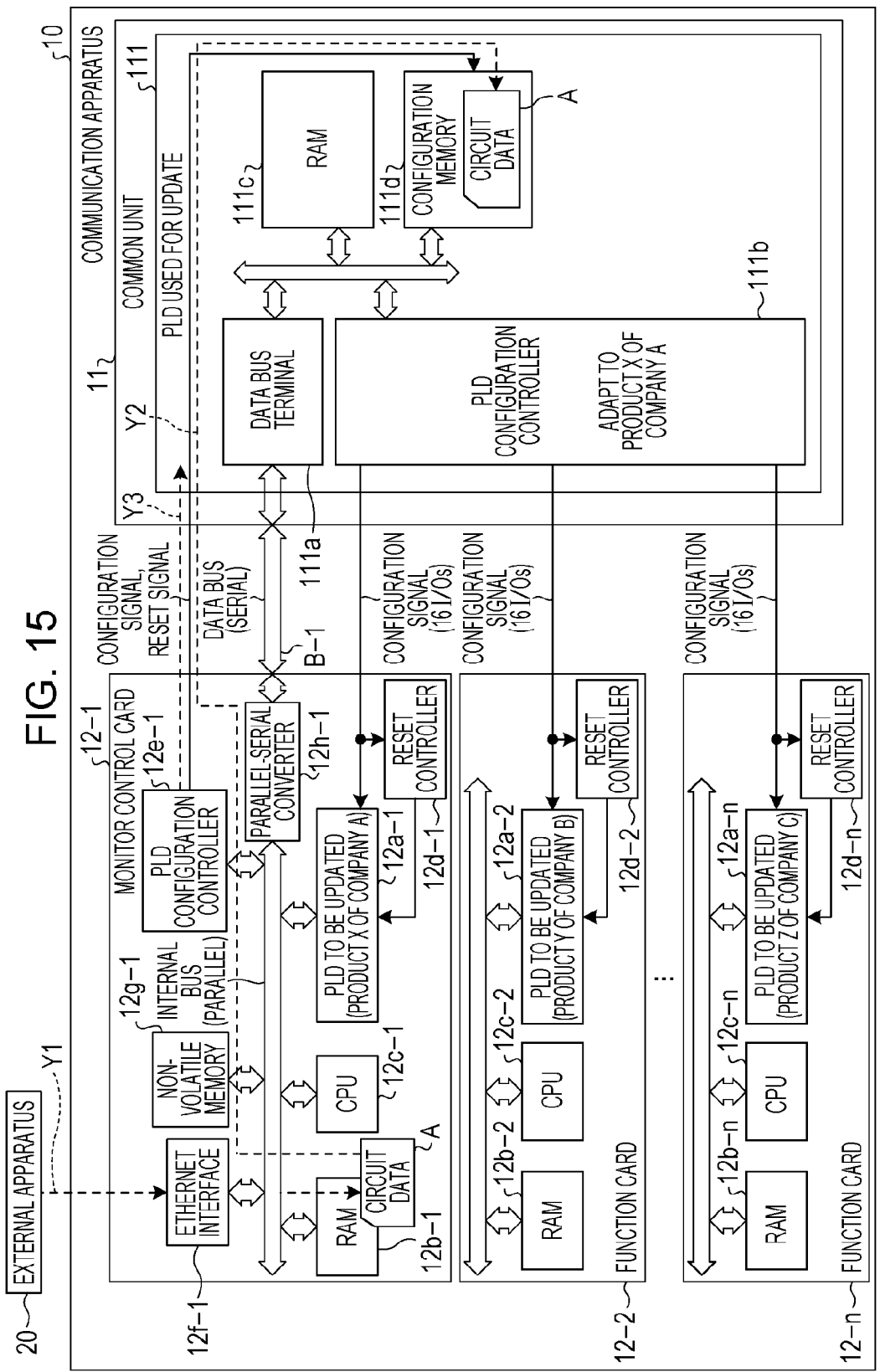
FIG. 15 is a diagram illustrating the first half of a circuit data rewriting process performed by a communication apparatus according to all the first to third modifications.

Hereafter, referring to FIGS. 15 and 16, the operation of a communication apparatus 10 according to all the first to third modifications will be described. FIG. 15 is a diagram illustrating the first half of a circuit data rewriting process performed by the communication apparatus 10 according to all the first to third modifications. A monitoring/control card 12-1 controls a PLD 111 used for update of a common unit 11. As illustrated in FIG. 15, the monitoring/control card 12-1 includes an Ethernet® interface 12f-1, a non-volatile memory 12g-1, and a parallel-serial converter 12h-1 as new components.

The Ethernet interface 12f-1 acquires data, including the circuit data A, B, C, X, Y, and Z, from an external apparatus 20. The non-volatile memory 12g-1 is a storage unit for storing data acquired by the interface and is, for example, a flash memory, a solid state drive (SSD), a hard disk drive (HDD), or the like. The parallel-serial converter 12h-1 converts a parallel signal passing through the internal bus of the monitoring/control card 12-1 into a serial signal to be passed through a data bus B-1.

Unlike the monitoring/control card 12-1, none of the other cards, 12-2, . . . , and 12-n, includes the Ethernet interface 12f-1, the non-volatile memory 12g-1, or the parallel-serial converter 12h-1. The other cards, 12-2, . . . , and 12-n, connect configuration signals from the PLD 111 of the common unit 11. There are disposed sixteen signal lines for transmitting or receiving these configuration signals in both directions. One of these signal lines is connected to reset controllers 12d-2, . . . , and 12d-n.

In Y1 of FIG. 15, the Ethernet interface 12f-1 of the monitoring/control card 12-1 acquires circuit data A for the PLD 12a-1 from the external apparatus 20 and stores it in the RAM 12b-1. The Ethernet interface 12f-1 also stores the circuit data A in the non-volatile memory 12g-1, as appropriate. In Y2, based on a configuration signal, the PLD configuration controller 12e-1 of the monitoring/control card 12-1 replaces circuit data in the configuration memory 111d of the PLD 111 with the circuit data A (see V1 of FIG. 11). In Y3, based on a reset signal, the PLD configuration controller 12e-1 of the monitoring/control card 12-1 resets the PLD 111 and, using the circuit data A, adapts the PLD configuration controller 111b to the PLD 12a-1 (the product X of the company A) of the monitoring/control card 12-1.

Figure 16:
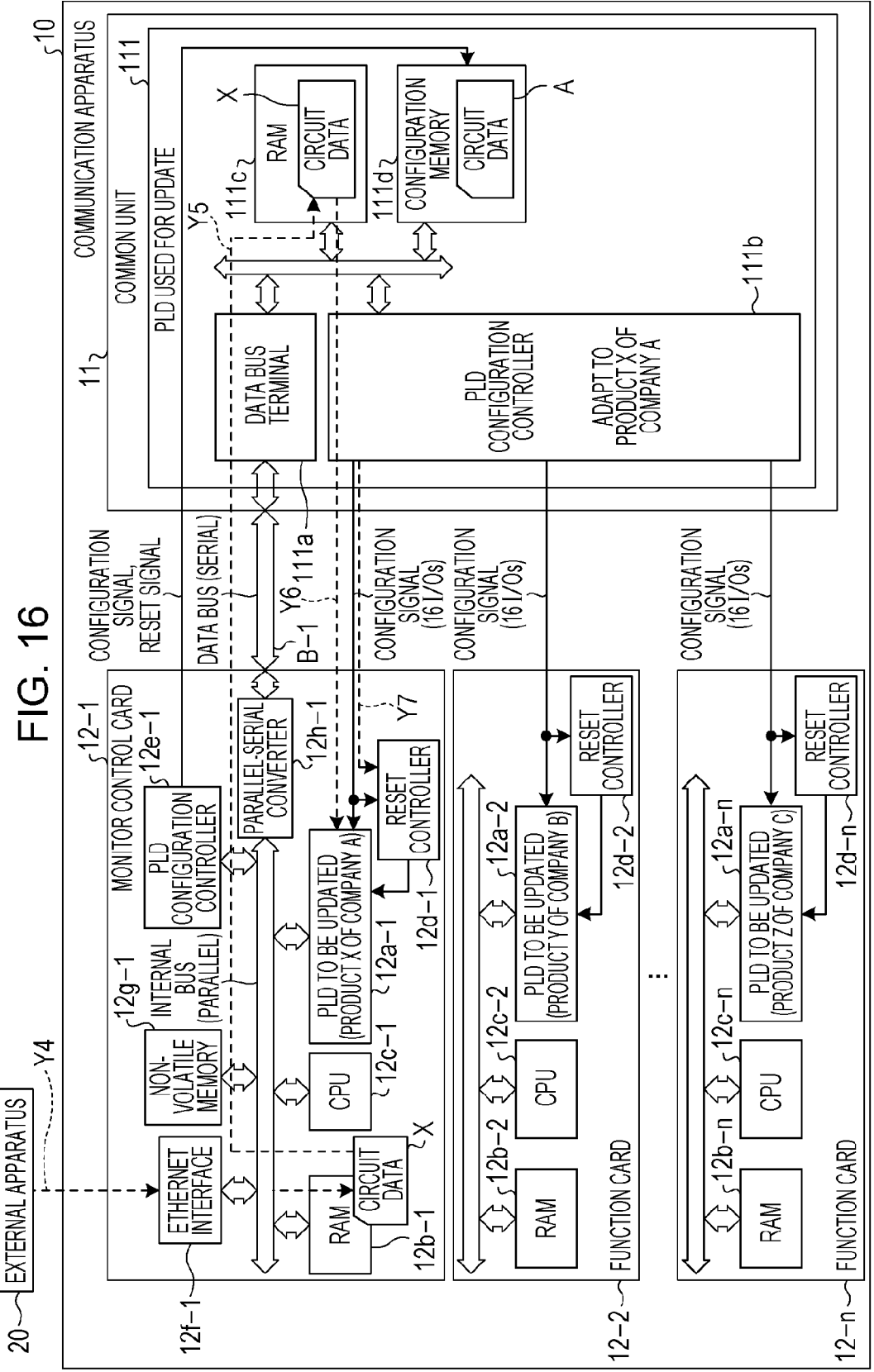
FIG. 16 is a diagram illustrating the second half of the circuit data rewriting process performed by the communication apparatus according to all the first to third modifications.

FIG. 16 is a diagram illustrating the second half of the circuit data rewriting process performed by the communication apparatus 10 according to all the first to third modifications. In Y4, the Ethernet interface 12f-1 of the monitoring/control card 12-1 acquires new circuit data X for the PLD 12a-1 from the external apparatus 20 and stores it in the RAM 12b-1. The Ethernet interface 12f-1 also stores the new circuit data X in the non-volatile memory 12g-1, as appropriate. In Y5, the CPU 12c-1 outputs the circuit data X stored in the RAM 12b-1 stored in Y4 to the PLD 111 through the data bus B-1. The PLD 111 receives the circuit data X and stores it in the RAM 111c (see V2 of FIG. 11).

In Y6, the PLD configuration controller 111b acquires the circuit data X outputted from the PLD 111 and, using the circuit data X, updates the internal configuration memory in the PLD 12a-1 (the product X of the company A) of the monitoring/control card 12-1 (see V3 of FIG. 11). In Y7, the PLD configuration controller 111b of the PLD 111 outputs a reset signal to the monitoring/control card 12-1, and the reset controller 12d-1 receives the reset signal and resets the PLD 12a-1. Thus, the functions of the PLD 12a-1 of the monitoring/control card 12-1 are updated.

The series of processes, Y1 to Y7, are also performed on the other cards, 12-2, . . . , and 12-n, in a similar manner.

While the PLD 111 of the communication apparatus 10 includes the RAM 111c in the embodiment and modifications thereof, the RAM 111c may be disposed outside the PLD 111. Similarly, while the PLD 111 includes the configuration memory 111d, the configuration memory 111d may be disposed outside the PLD 111. The RAM 111c preferably has a sufficient capacity greater than or equal to a predetermined value so as to be capable of storing circuit data of cards which may be added in the future.

While the communication apparatus 10 is used as an apparatus for updating a device in the embodiment and modifications thereof, the embodiment and modifications may be applied to apparatuses having no communication function. Further, the cards 12-1, 12-2, . . . , and 12-n are not limited to communication cards and may be, for example, Ether security cards, Wavelength Division Multiplexing (WDM) cards, packet processing cards, which map packets to the Synchronous Optical Network (SONET), or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus for updating a first device, comprising:
a card mounted in the apparatus and configured to include the first device, the card holding first circuit data;
a second device configured to include a programmable controller, a first memory, and a second memory, wherein
the card is configured to transmit the first circuit data to the first memory,
the programmable controller is programmed to update the second device with the first circuit data received in the first memory,
the second device is configured to acquire second circuit data from the card and store the second circuit data in the second memory, the second circuit data corresponds to the first circuit data,
the programmable controller is further programmed to transmit the second circuit data stored in the second memory to the first device, and
the first device is further configured to replace circuit data in an internal configuration memory of the first device with the second circuit data.

2. The apparatus according to claim 1, wherein
the apparatus comprises a plurality of cards including the card, and
one of the cards is connected to the second device through a data bus configured to input or output the first circuit data and second circuit data.

3. The apparatus according to claim 2, wherein the programmable controller is further programmed to:
acquire the second circuit data output parallel from the second device that is updated, and
update first devices of the cards by using the second circuit data.

4. The apparatus according to claim 2, wherein one of the cards outputs the first circuit data to the second device through a signal line different from the data bus.

5. An apparatus for updating a first device, comprising:
a card mounted in the apparatus and configured to include the first device, the card holding first circuit data;
a second circuit device configured to include a programmable controller, a first memory, and a second memory,
the card is configured to transmit the first circuit data to the first memory,
the second device is configured to acquire second circuit data from the card and store the second data in the second memory, the second circuit data corresponds to the first circuit data,
the programmable controller is programmed to execute a procedure including
updating the second device with the first circuit data received in the first memory; and
transmitting the second circuit data stored in the second memory to the first device;
wherein the first device is configured to replace circuit data in an internal configuration memory of the first device with the second circuit data.

6. A method for updating a first device, comprising:
transmitting first circuit data to a first memory from a card mounted in an apparatus and configured to include the first device;
updating a second device configured to include a programmable controller, the first memory, and a second memory with the first circuit data received in the first memory;
acquiring second circuit data from the card, the second circuit data corresponds to the first circuit data;
storing the second circuit data in the second memory;
transmitting the second circuit data stored in the second memory to the first device; and
replacing circuit data in an internal configuration memory of the first device with the second circuit data.

* * * * *